United States Patent
Adetutu et al.

(10) Patent No.: US 7,524,707 B2
(45) Date of Patent: Apr. 28, 2009

(54) MODIFIED HYBRID ORIENTATION TECHNOLOGY

(75) Inventors: Olubunmi O. Adetutu, Austin, TX (US); Mariam G. Sadaka, Austin, TX (US); Ted R. White, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 512 days.

(21) Appl. No.: 11/209,869

(22) Filed: Aug. 23, 2005

(65) Prior Publication Data

US 2007/0048919 A1 Mar. 1, 2007

(51) Int. Cl.
*H01L 21/44* (2006.01)

(52) U.S. Cl. .................. 438/150; 438/153; 438/222; 438/226; 438/199

(58) Field of Classification Search .............. 438/150, 438/199, 153, 222, 226
See application file for complete search history.

(56) References Cited

U.S. PATENT DOCUMENTS

| | | | |
|---|---|---|---|
| 2004/0069991 A1* | 4/2004 | Dunn et al. | 257/75 |
| 2005/0093104 A1 | 5/2005 | Ieong et al. | 257/627 |
| 2006/0043571 A1* | 3/2006 | Mousa et al. | 257/700 |
| 2006/0065930 A1* | 3/2006 | Kelman | 257/351 |

OTHER PUBLICATIONS

M. Yang et al., "High Performance CMOS Fabricated on Hybrid Substrate with Different Crystal Orientations," IEEE, IEDM 2003, pp. 453-456.
T. Mizuno et al., "Physical Mechanism for High Hole Mobility in (110)-Surface Strained—and Unstrained-MOFSETs," IEEE, IEDM 2003, pp. 809-812.
T. Ghani et al., "A 90nm High Volume Manufacturing Logic Technology Featuring Nove, 45nm Gate Length Strained Silicon CMOS Transistors," IEEE, IEDM 2003, pp. 978-980.
B. Doris et al., A Simplified Hybrid Orientation Technology (SHOT) for High Performance CMOS, VLSI Technology, Digest of Technical Papers, 2004 Symposium, pp. 86-87.
B. Jin et al., "Mobility Enhancement in Compressively Strained SiGe Channel pMOFSET with HfO2/TiN Gate Stack," Abs. 1293, 206th Meeting, 2004, The Electrochemical Society, Inc.

* cited by examiner

*Primary Examiner*—Ha Tran T Nnguyen
*Assistant Examiner*—Chakila Tillie
(74) *Attorney, Agent, or Firm*—Hamilton & Terrile, LLP; Michael Rocco Cannatti

(57) ABSTRACT

A semiconductor process and apparatus includes forming first and second metal gate electrodes (151, 161) over a hybrid substrate (17) by forming the first gate electrode (151) over a first high-k gate dielectric (121) and forming the second gate electrode (161) over at least a second high-k gate dielectric (122) different from the first gate dielectric (121). By forming the first gate electrode (151) over a first SOI substrate (90) formed by depositing (100) silicon and forming the second gate electrode (161) over an epitaxially grown (110) SiGe substrate (70), a high performance CMOS device is obtained which includes high-k metal PMOS gate electrodes (161) having improved hole mobility.

15 Claims, 3 Drawing Sheets

MODIFIED HYBRID ORIENTATION TECHNOLOGY

BACKGROUND OF THE INVENTION

1. Field of the Invention

The present invention is directed in general to the field of semiconductor devices. In one aspect, the present invention relates to high-performance complementary metal oxide semiconductor (CMOS) field effect transistors (FETs) fabricated on hybrid substrates.

2. Description of the Related Art

CMOS devices, such as NMOS or PMOS transistors, have conventionally been fabricated on semiconductor wafers that have a single crystal orientation, such as Si having a (100) crystal orientation. Those skilled in the art have discovered that electron mobility for NMOS devices is highest when such NMOS devices are built on a (100) surface-oriented substrate, but the hole mobility for PMOS devices built on a (100) substrate is fairly degraded. That is, hole mobility values on (100) Si are roughly 2×-4× lower than the corresponding electron mobility for this crystallographic orientation. On the other hand, it is also known that hole mobility for PMOS devices is more than doubled on a (110) surface-oriented substrate, while the electron mobility for NMOS devices built is degraded with this substrate orientation. As a result, PMOS devices formed on a (110) surface will exhibit significantly higher drive currents than PMOS devices formed on a (100) surface. Prior attempts to address this problem have attempted to form hybrid substrates with different surface orientations using semiconductor-on-insulator (SOI) wafer bonding to provide PMOS and NMOS devices with their own optimized crystal orientation.

Additional challenges are posed by the ever shrinking size and scaling of semiconductor device technology. For example, gate leakage current due to direct tunneling through thinner silicon oxide gate layers is an additional problem with smaller devices. An additional challenge posed by decreasing feature sizes is that aspects of device design and fabrication that previously gave rise to only second-order effects in long-channel devices can no longer be ignored. For example, the scaling of channel length and gate oxide thickness in a conventional MOS transistor exacerbates problems of polysilicon gate depletion, high gate resistance, leakage current and dopant (i.e., boron) penetration into the channel region of the device.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
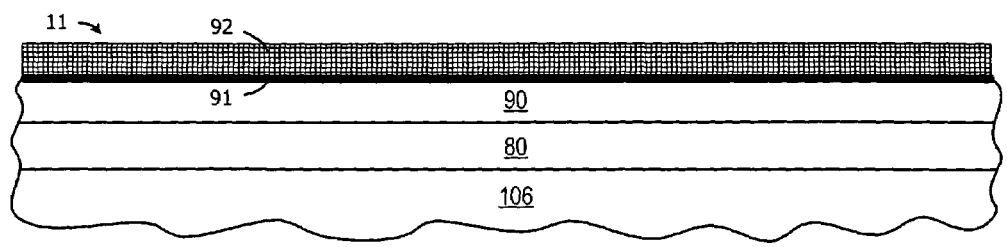
FIG. 1 is a partial cross-sectional view of a semiconductor wafer structure on which first oxide and nitride layers are deposited over SOI layers, including a semiconductor layer having a first crystalline structure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid substrates with optimized crystal orientations for PMOS and NMOS devices with high-k and metal gates. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid obscuring the present invention. Such descriptions and representations are used by those skilled in the art to describe and convey the substance of their work to others skilled in the art.

There is disclosed a method and apparatus for fabricating high performance CMOS devices with hybrid substrates with optimized crystal orientations for PMOS and NMOS devices using selective growth of epitaxial SiGe on (110) Si to form PMOS channels with high-k gate dielectrics and metal gates (or polysilicon or silicon germanium gates), thereby providing improved hole mobility for PMOS devices without impacting NMOS performance. The improved performance resulting from such hybrid substrate devices may be advantageously used with newer CMOS device technology which contemplates the use of dual-metal gate conductors and high dielectric constant (high-k) gate dielectrics to overcome the performance limitations of CMOS technology, which used polysilicon gate conductors with silicon dioxide gate dielectric. Metal gates obviate gate-depletion and boron-penetration effects and provide a significantly lower sheet resistance, while high-k gate dielectric materials enable the deposition of thicker gate dielectric layers without adversely affecting the physical and electrical thickness characteristics of the deposited dielectric layer (compared with thinner silicon dioxide dielectric layers). However, the use of high-k gate dielectric layers to make single and dual metal gate devices creates new design challenges, such as pinning the work function of the gate electrodes toward the middle of the silicon band gap and increased charge (electron and hole) scattering which leads to decreased mobility, particularly for PMOS devices, which has a negative impact on device parameters including threshold voltage and drive current.

Various illustrative embodiments of the present invention will now be described in detail with reference to FIGS. 1-9. It is noted that, throughout this detailed description, certain layers of materials will be deposited and removed to form the semiconductor structure. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

FIG. 1 is a partial cross-sectional view of a semiconductor wafer structure 11 on which Silicon-On-Insulator (SOI) layers having a first crystalline structure semiconductor layer are formed under deposited layers of oxide and nitride. Specifically, the structure 11 includes a first semiconductor layer 106 formed of a semiconductor material that has a first crystallographic orientation. Depending on the type of transistor device being fabricated, the first semiconductor layer 106 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. The crystallographic orientation of the first semiconductor layer 106 may be (110), (111), or (100).

The structure 11 includes an insulator layer 80 formed on the first semiconductor layer 106 which will ultimately be used to form the buried oxide (BOX) layer for silicon-on-insulator devices. Silicon wafer bonding to obtain insulating layers between wafers to achieve semiconductor-on-insulator structure is known and described, for example, by J. B. Lasky, "Silicon-On-Insulator (SOI) by bonding and etch-back", IEDM Tech. Dig, p. 684 (1985).

The structure 11 also includes a second semiconductor layer 90 formed of a semiconductor material which has a second crystallographic orientation which is different from the first crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other III/V or II/VI compound semiconductors or any combination thereof. The crystallographic orientation of the second semiconductor layer 90 may be (100), (111), or (110), so long as the crystallographic orientation of the second semiconductor layer 90 differs from the crystallographic orientation of the first semiconductor layer 106. The crystal orientations of the first semiconductor layer 106 and the second semiconductor layer 90 will depend on the materials used to form the wafer structure 11. For example, when Si is employed as the semiconductor material, electron mobility is higher on a (100) surface orientation, and hole mobility is higher on a (110) surface orientation. In this case, the (100) Si surface is used as the substrate layer for NMOS devices, while the (110) Si surface is used as the substrate layer for PMOS devices. An oxide layer 91 is deposited on the second semiconductor layer 90, followed by deposition of a nitride layer 92. In particular, after forming the first oxide layer 91 and nitride layer 92, a mask layer may be formed on an exposed upper surface of the nitride layer 92 using a deposition process such as, for example, chemical vapor deposition (CVD), plasma-enhanced chemical vapor deposition (PECVD), chemical solution deposition, atomic layer deposition, or physical vapor deposition, or by using a thermal oxidation, nitridation or oxynitridation process.

Figure 2:
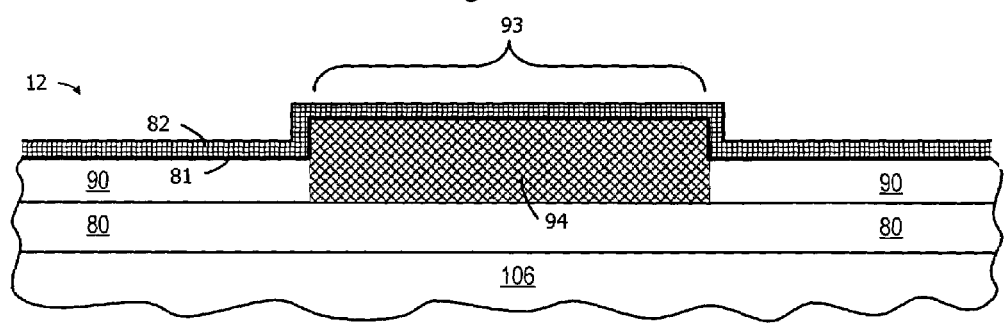
FIG. 2 illustrates processing subsequent to FIG. 1 where portions of the first oxide layer, the first nitride layer and a second semiconductor layer have been removed and replaced with a deposited oxide layer, and where second oxide and nitride layers have been formed in place of the remaining first oxide layer and nitride layer.

FIG. 2 illustrates processing of a semiconductor wafer structure 12 subsequent to FIG. 1 in which a portion of the second semiconductor layer 90 is replaced with an oxide layer 94. For example, using the oxide layer 91 and nitride layer 92 as a mask layer, conventional patterning and anisotropic etching techniques may be used to form an opening 93 in the mask layer 91, 92 and second semiconductor layer 90. In this opening 93, an oxide layer 94 is formed to replace the second semiconductor layer 90 in the opening 93 by depositing an overlying layer of oxide and then polishing the oxide back to level with the mask layers 91, 92 (as shown in FIG. 1) or back to the level of the second semiconductor layer 90 (not shown). Subsequently, the remaining unetched portions of the first nitride layer 92 and all or part of the first oxide layer 91 are stripped, and second oxide and nitride layers 81, 82 are formed over the second semiconductor layer 90 and oxide layer 94, as shown in FIG. 2.

Figure 3:
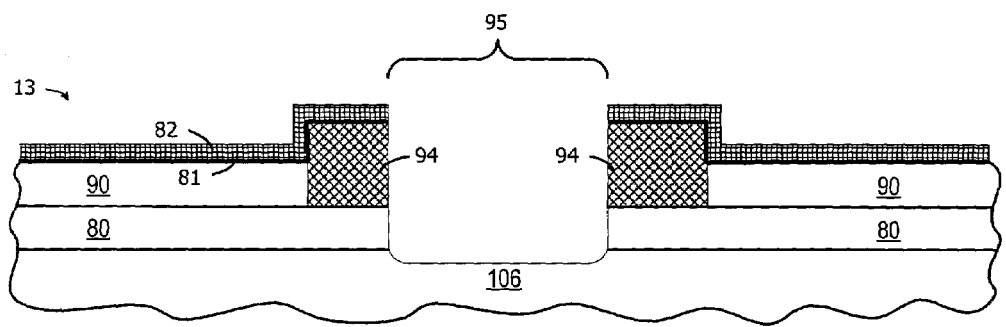
FIG. 3 illustrates processing subsequent to FIG. 2 in which portions of the deposited oxide layer, second oxide layer, second nitride layer and the buried oxide layer have been etched or removed.

FIG. 3 illustrates processing of a semiconductor wafer structure 13 subsequent to FIG. 2 in which at least selected portions of the second oxide and nitride layers 91, 92, oxide layer 94 and buried oxide layer 80 have been removed by patterning and etching to remove an exposed portion of the oxide layer 94 and insulator layer 80, thereby forming a second etch opening 95 to the exposed first semiconductor layer 106. The pattern transfer and etching of the mask layer may use one or more etching steps to selectively remove the unprotected portions of the oxide layers 94, 80, including a dry etching process such as reactive-ion etching, ion beam etching, plasma etching or laser etching, a wet etching process wherein a chemical etchant is employed or any combination thereof.

The opening 95 is used to define and differentiate active regions for first and second types of MOS devices subsequently formed on the wafer structure 13. For example, the unetched portions of the second semiconductor layer 90 define a first device region for a first type of MOS device, while the portions of the first semiconductor layer 106 that is exposed by the opening 95 (and that is subsequently epitaxially regrown, as described hereinbelow) defines a second device region for a second type of MOS device. To this end, the unetched portions of the oxide layer 94 may be used to form at least part of the shallow trench isolation regions for electrically and physically isolating the first and second device regions from one another by designing the width and placement of the second etch opening 95 to be smaller than the width of the first etch opening 93, and preferably centered around the first etch opening 93. Alternatively, sidewall spacers (not shown) may be formed in or adjacent to the opening 95 on the exposed sidewalls of the SOI layers 80, 90 by depositing and etching any material having suitable properties, such as oxide, nitride, oxynitride or any combination.

Figure 4:
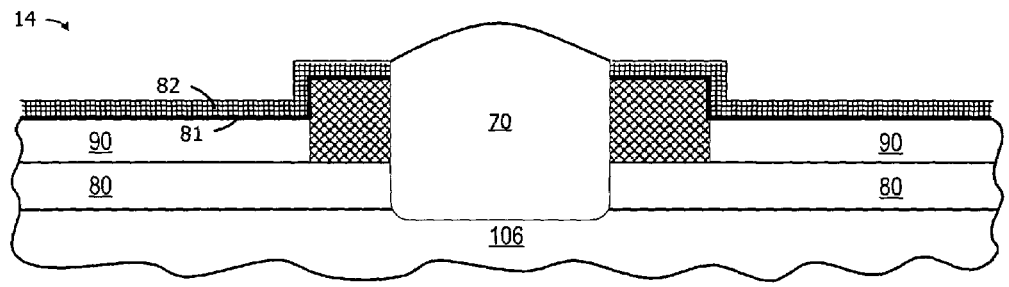
FIG. 4 illustrates processing subsequent to FIG. 3 after selective epitaxial growth of SiGe having a second crystalline structure semiconductor layer.

In the opening 95, a semiconductor layer 70 is then formed on the exposed surface of the first semiconductor layer 106 to provide the structure shown, for example, in FIG. 4 which illustrates processing of a semiconductor wafer structure 14 subsequent to FIG. 3. By forming the semiconductor layer 70 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 70 is epitaxially grown from the first semiconductor layer 106, they will have the same crystallographic orientations, though the layers 70, 106 can be formed of different semiconductor materials. By optimizing the crystallographic orientations of the layers 70, 106 (e.g., so that the epitaxially grown layer 70, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices formed over silicon dioxide gate layers.

While the use of different crystal orientations in the substrate materials can improve mobility for transistor devices formed with silicon dioxide gate dielectrics, these improvements are not fully achievable for transistor devices formed with high-k gate dielectrics. Accordingly, a selected embodiment of the present invention further enhances mobility by forming the semiconductor layer 70 with epitaxially grown SiGe material having a crystallography orientation (e.g., (110)) that is different from the crystallography orientation of the second semiconductor layer 90 (e.g., (100)). Depending on the type of transistor device being fabricated, the semiconductor layer 70 may be formed from any semiconductor material, such as Si, strained Si, SiGe, SiC, SiGeC or combinations thereof, which is capable of being formed utilizing a selective epitaxial growth method. For example, if PMOS devices are formed over the semiconductor layer 70, the semiconductor layer 70 may be formed by epitaxially growing SiGe having a crystallographic orientation (e.g., (110)) that is the same as the crystallographic orientation of the first semiconductor layer 106. This epitaxial growth may be achieved by heating the semiconductor wafer structure 13 to a temperature between 500 and 900° C. in the presence of dichlorosilane, germanium, HCL and hydrogen gas. Alternatively, if NMOS devices are formed over the semiconductor layer 70, at least a portion of the epitaxially grown layer 70 may be formed by epitaxially growing silicon having a (100) crystallographic orientation. In this case, the second semiconductor layer would have a (110) crystallographic orientation, and the PMOS device would be built on this layer.

As illustrated in FIG. 4, the semiconductor layer 70 may be grown to completely fill and overflow the opening 95 (so that it is higher than the second conductive layer 90 or higher than the mask layers 81, 82) and then polished down to the mask layer using a chemical mechanical polishing (CMP) process. However, it will be appreciated that a variety of techniques may be used to form the epitaxially grown semiconductor layer (or epi-layer) 70. Selected embodiments of the present invention also contemplate using strained or compressed materials to further enhance mobility. For example, by forming at least part of the epi-layer 70 with epitaxially grown compressed SiGe having a first crystal orientation to form the transistor channels for PMOS devices having high-k gate dielectric layers, improved hole mobility is obtained. In addition, by grading the content of germanium so that any epitaxially grown SiGe layer or region 70 contains between 10-100 percent germanium, the relaxation of the SiGe may be reduced. Alternatively, reduced relaxation may be achieved by grading the content of germanium so that the SiGe contains between 30-40 percent germanium as the material is grown in the opening 95, and/or by variably grading the germanium content as the SiGe material is grown in the opening 95. Yet another approach for reducing the relaxation in the upper portion of the SiGe region 70 is to epitaxially grow the SiGe region 70 as shown in FIG. 4, followed by a chemical mechanical polishing step to polish the SiGe region 70, after which a thin (e.g., 10-20 angstroms) silicon cap layer (not shown) is formed on the polished SiGe region 70. When the SiGe region 70 is formed with n-type material, the second conductive layer 90 in the SOI region may be formed of depositing strained p-type semiconductor material having a second crystal orientation that is different from the first crystal orientation.

Figure 5:
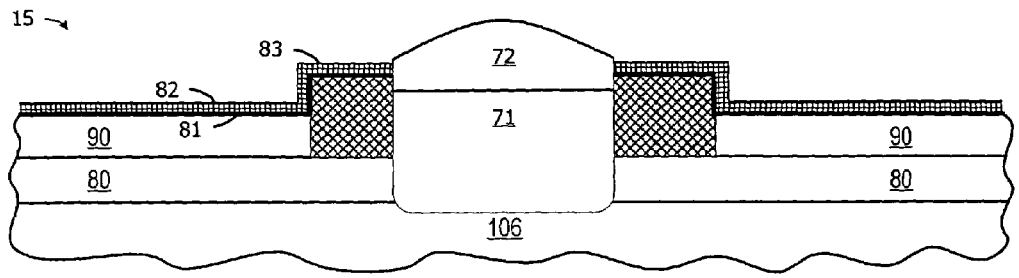
FIG. 5 which illustrates an alternative embodiment for processing of a semiconductor wafer structure subsequent to FIG. 3.

Yet another alternative for forming the epitaxially grown semiconductor region is shown in FIG. 5 which illustrates an alternative embodiment for processing of a semiconductor wafer structure 15 subsequent to FIG. 3. In this alternative embodiment, an epitaxially grown semiconductor region is formed by initially growing (e.g., epitaxially) a relatively thick layer of silicon 71 in the opening 95 which does not completely fill the opening 95. In a selected embodiment, the relatively thicker silicon layer 71 is between 500-2100 angstroms thick. Subsequently, a relatively thinner layer of SiGe 72 is grown over the relatively thick layer of silicon 71. In a selected embodiment, the relatively thinner SiGe layer 72 is between 10-500 angstroms thick. By selecting the relative thicknesses of the first and second layers 71, 72, a compressed, high quality layer of epitaxial SiGe is formed near the surface of the subsequently formed active device area.

As will be appreciated, the SOI and epi-layer substrates may also be switched so that PMOS devices are formed on the SOI region 90 while NMOS devices are formed on the epi-layer 70. This may be accomplished by depositing compressed SiGe having a first crystal orientation to form the first semiconductor layer 90 for the PMOS devices, and epitaxially growing compressed or strained semiconductor material having a second crystal orientation to form the epi-layer or region 70 for the NMOS devices.

Figure 6:
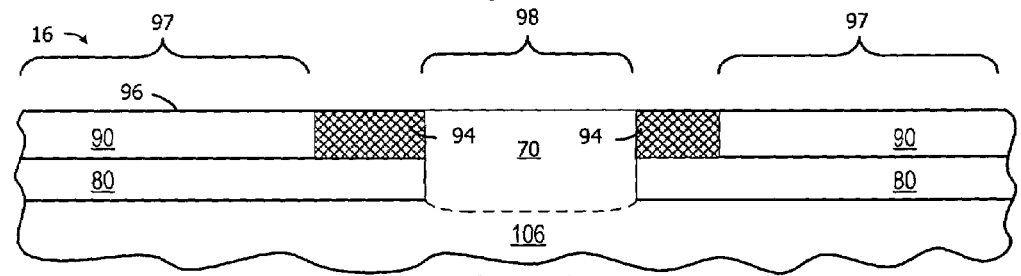
FIG. 6 illustrates processing subsequent to FIG. 4 in which a portion of the SiGe has been etched back and the layers of oxide and nitride have been removed.

FIG. 6 illustrates processing of a semiconductor wafer structure 16 subsequent to FIG. 4 in which the semiconductor layer 70 has been etched back to the same level as the second semiconductor layer 90 and the layers of oxide 81 and nitride 82 have been removed in order to achieve a substantially coplanar surface 96. Of course, the semiconductor layer 70 may be etched back to a lesser extent (i.e., so that it is coplanar with the uppermost surface 83 of the nitride layer 82). In either case, the semiconductor layer 70 is substantially coplanar with the second semiconductor layer 90 to facilitate CMOS processing. Chemical mechanical polishing or any desired etchant process may be used to etch back the semiconductor layer 70, including dry etching, wet etching or oxidation of silicon and then stripping away the oxide. As for the removal of mask layers 81, 82, any desired stripping process may be used that is capable of selectively removing the patterned mask layers 81, 82 from the structure 16. As a result of the foregoing steps, shallow trench isolations regions formed from the unetched oxide layer 94 serve to provide electrical and physical isolation between transistor devices in the first semiconductor active device region 97 and transistor devices in the second semiconductor active device region 98. It will be appreciated that isolation regions may also be formed as field oxide regions or isolation dielectric trenches using any desired process. For example, isolation regions comprised of a silicon-oxide (or other dielectric) compound may be formed by defining trench areas with mask and patterning steps, etching trenches in selected portions of the layers 90, 80, 106, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer structure 16 is thermally oxidized to form the isolation dielectric.

Figure 7:
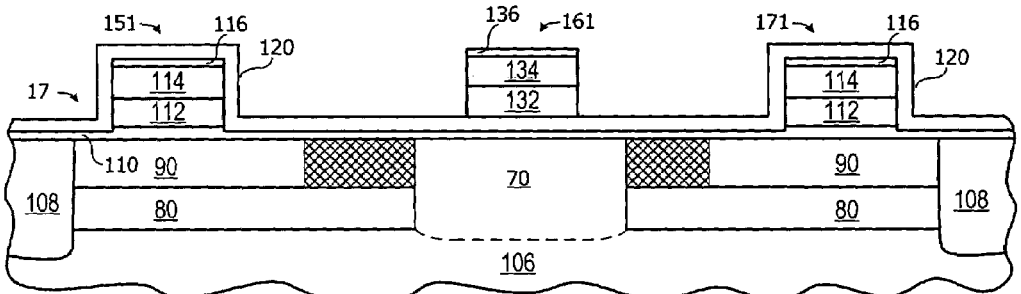
FIG. 7 illustrates processing subsequent to FIG. 6 in which first and second gate electrodes are partially formed with one or more high-k gate dielectric layers.

FIG. 7 illustrates processing of a semiconductor wafer structure 17 subsequent to FIG. 6 in which first and second metal gate electrodes are formed with one or more high-k gate dielectric layers to provide a high performance CMOS device. For example, PMOS and NMOS devices may be formed on the exposed semiconductor layers (i.e., second semiconductor layer 90 and regrown semiconductor layer 70), which may include well regions (not shown) in each layer 70, 90. Specifically, a first semiconductor device 151 is an NMOS device formed on a portion of the second conductive layer 90 in the SOI region, and a second semiconductor device 161 is a PMOS device formed on a portion of the regrown second semiconductor layer 70. Alternatively, the first semiconductor device 151 may be a PMOS device and the second semiconductor device 161 may be an NMOS device. The allocation of device types to device regions preferably exploits the differing crystal orientation of the underlying layers 70, 90, to provide a high performance CMOS device where the PMOS device has improved hole mobility. This may be accomplished, for example, by forming the PMOS devices over the semiconductor material that has a (110) or (111) orientation, whereas the NMOS devices are formed over a semiconductor surface having a (100) orientation. In addition, the hole mobility of the PMOS devices may be further improved by forming the PMOS gate electrodes over a layer of compressed silicon germanium having a (110) orientation.

Different processing steps may be used to form the depicted gate electrode structures and to complete their fabrication into functioning transistors. As examples, one or more sacrificial oxide formation, stripping, extension implant, halo implant, spacer formation, source/drain implant, and polishing steps may be performed to complete the gate transistors 151, 161, 171. In addition, conventional backend processing (not depicted) typically including multiple levels of interconnect is then required to connect the transistors in a desired manner to achieve the desired functionality. Thus, the specific sequence of steps used to complete the fabrication of the gate transistors 151, 161, 171 may vary, depending on the process and/or design requirements. For example, additional processing details for fabricating metal gate electrode and high-k dielectric layers are set forth in U.S. Patent Application Publication No. 20050085092 entitled "Multi-layer dielectric containing diffusion barrier material" and in U.S. patent application Ser. No. 11/139,765 entitled "Reverse ALD." However, in the semiconductor wafer structure 17 depicted in FIG. 7, a dual gate integrated circuit device formed with a CMOS fabrication process is illustrated where at least one gate electrode is formed over one or more relatively high-k gate dielectric layers. As will be appreciated, a relatively high-k dielectric is a dielectric having a dielectric constant that is higher than (e.g., at least 1.5 times) the dielectric constant of $SiO_2$. The deposition of high-k gate dielectrics can mitigate some of the challenges of silicon dioxide grown on SiGe, such as germanium segregation, migration away from oxygen during oxide growth processing and gate leakage.

As depicted in FIG. 7, wafer structure 17 includes a first SOI region 90—in which may be formed a first well region (not shown)—and a second epi-layer region 70—in which may be formed a second well region (not shown)—that are laterally displaced with respect to one another. The first and second well regions contain impurities such that one of the wells is a p-doped well and one of the wells is an n-doped well. In the described embodiment, the first well in the SOI region 90 is a p-doped well (p-well) in which NMOS transistors are formed, and the second well in the epi-layer 70 is an n-doped well (n-well) in which PMOS transistors are formed.

Following the formation of wells and isolation trenches, at least a first gate dielectric layer 110 is blanket deposited across the entire wafer structure 17. The first dielectric layer may be used to form at least part of the gate dielectric for all transistors on the wafer, or alternatively, the first dielectric layer may be used for only a first type of transistor formed on the wafer. In the depicted embodiment, the first dielectric layer 110 will serve as at least part of the gate dielectric for all transistors formed on the wafer structure 17. In an embodiment in which the first well in the SOI region 90 is a (100)-oriented p-well region and the second well in the epi-layer 70 is a (110)-oriented n-well region, at least part of the first gate dielectric layer 110 is used as at least part of the gate dielectric in the NMOS and PMOS transistors. In one such implementation, first dielectric layer 110 is a metal-oxide compound formed by chemical vapor deposition or by atomic layer deposition having a typical final thickness is in the range of 0.1-10 nanometers. A suitable metal oxide compound for use as first dielectric layer 110 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties.

After forming the first dielectric layer 110, one or more first gate electrodes 151, 171 are formed above first well region 90 using a metal gate electrode formation sequence. For example, the gate electrode 151 may be formed from a single conductive layer or by sequentially depositing or forming a gate electrode layer 112, a conductive layer 114, and a third gate electrode layer 116 over the first dielectric layer 110 to form a first gate stack. In one embodiment, gate electrode layer 112 is a TaSiN layer having a thickness in the range of 1-20 nanometers, though other gate layer materials may be used, such as polysilicon, SiGe or other silicon-based materials. In another embodiment, gate electrode layer 112 is a TaC or $TaC_XN_Y$ layer having a thickness in the range of 1-100 nanometers. The conductive layer 114 is an optional layer that may be used, for example, to simplify integration issues. Conductive layer 114 may be a heavily doped polysilicon, tungsten, or another suitable electrically conductive material having a thickness in the range of approximately 10-100 nanometers. Layer 116 may be another metal or may be a conducting or non-conducting layer. Once the first gate stack is formed, conventional gate electrode etch processing steps may be used to form the desired gate electrode 151 and/or to clear or partially etch the remaining exposed portions of the first gate dielectric layer 110.

Following formation of the first gate electrodes 151, 171, a second gate dielectric layer 120 may optionally be formed over wafer structure 17, such as by using conventional chemical vapor deposition, oxide growth or atomic layer deposition techniques. The second gate dielectric layer 120 may be a different material than first gate dielectric 110 and the thickness of the second gate dielectric 120 over second well region 70 may be different than the thickness of first gate dielectric 110 over first well region 90. Either or both of the first gate dielectric layer 110 and the second gate dielectric layer 120 are high-k dielectrics. As will be appreciated, a high-k dielectric is a dielectric having a dielectric constant that is at least 1.5 times the dielectric constant of $SiO_2$. In an embodiment suitable for its use in conjunction with PMOS transistors (such as those formed with TiN, MoON, MoN, $IrO_x$, $ReO_x$, $RuO_x$, Ti, Ta, $W_2N$, etc.) having a gate electrode, the second gate dielectric 120 serves as a gate dielectric cap layer for the PMOS transistor devices, and may be implemented as an atomic layer deposited (ALD) dielectric film (e.g., $Al_2O_3$) having a thickness in the range of 0.5-10 nanometers. Although the second gate dielectric layer 120 is depicted in FIG. 7 as being formed on the remaining, unetched portion of the first gate dielectric 110 over the second well region 70, it will be appreciated that the second gate dielectric layer 120 may also be formed on the surface of the second well region 70 when the first gate dielectric layer 110 has been cleared entirely from the exposed portions of the wafer surface.

After formation of the first gate electrodes 151, 171 and second gate dielectric 120, a second gate electrode 161 is formed above second well region 70 using a metal gate electrode formation sequence. For example, the gate electrode 161 may be formed from a single conductive layer or by sequentially depositing or forming a gate electrode layer 132, a conductive layer 134, and a third gate electrode layer 136 over the second dielectric layer 120 to form a second gate stack which is etched to form the second gate electrode 162. In one embodiment, gate electrode layer 132 is a TiN layer having a thickness in the range of 1-100 nanometers. When the second gate electrode 161 is formed separately from the first gate electrode using a single conductive layer or a sequence of layers 132, 134, 136 formed over the second well region, the composition and thickness of the second gate electrode 161 may be equivalent to or different from the composition and thickness of the first gate electrode 151. Whatever the composition and thickness of the first and second gate electrodes, the gate dielectric layers under the first and second gate electrodes may advantageously be formed to have an equivalent electrical thickness.

Figure 8:
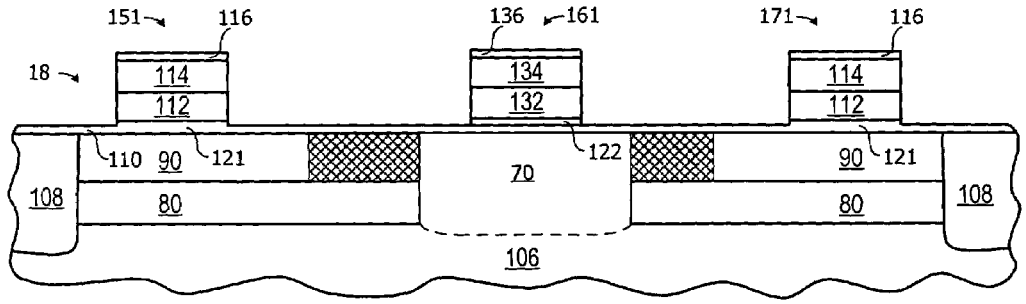
FIG. 8 illustrates processing subsequent to FIG. 7 in which the exposed portions of a second dielectric layer are removed.

Referring to FIG. 8, a selective and controlled etch process may be used to remove at least a thin layer from any exposed portion of the second gate dielectric layer 120. At the conclusion of the etching process, a remnant portion 122 of the second gate dielectric layer 120 under the second gate electrode 161 remains to form all or part of the gate dielectric for the second gate electrode 161, while the remnant portion 121 of the first gate dielectric for the first gate electrode 151 is formed entirely from the first gate dielectric layer 110.

As explained herein, a selected embodiment of the invention may include forming a gate electrode having a gate dielectric formed with one or more gate dielectric layers. In one variation, a two-layered gate dielectric is formed over both the first and second wells. In another variation, both well regions may have single-layered dielectrics formed from the same material, but with different thicknesses, by forming the first gate electrodes over an underlying gate dielectric layer having a first thickness, and then etching the exposed gate dielectric layer to a second thickness before forming the second gate electrodes over the thinner gate dielectric layer. Alternatively, both well regions may have single-layered dielectrics, but with different compositions. In yet another variation, the gate dielectric over one of the wells is a single-layered dielectric while the gate dielectric over the second well is a two-layered dielectric. For example, a first dielectric layer having a first composition, preferably 5 to 100 angstroms thick, could be the same on both the NMOS and PMOS sides. A second dielectric layer having a second composition, preferably 5 to 20 angstroms thick, may overlay only the second well. This second layer essentially helps un-pin the Fermi level of its PMOS gate electrode. Of course, the double gate dielectric could be on the NMOS side while the single gate dielectric is on the PMOS side. As will be appreciated, the gate electrode(s) may be formed using a gate dielectric formed with three or more gate dielectric layers.

Figure 9:
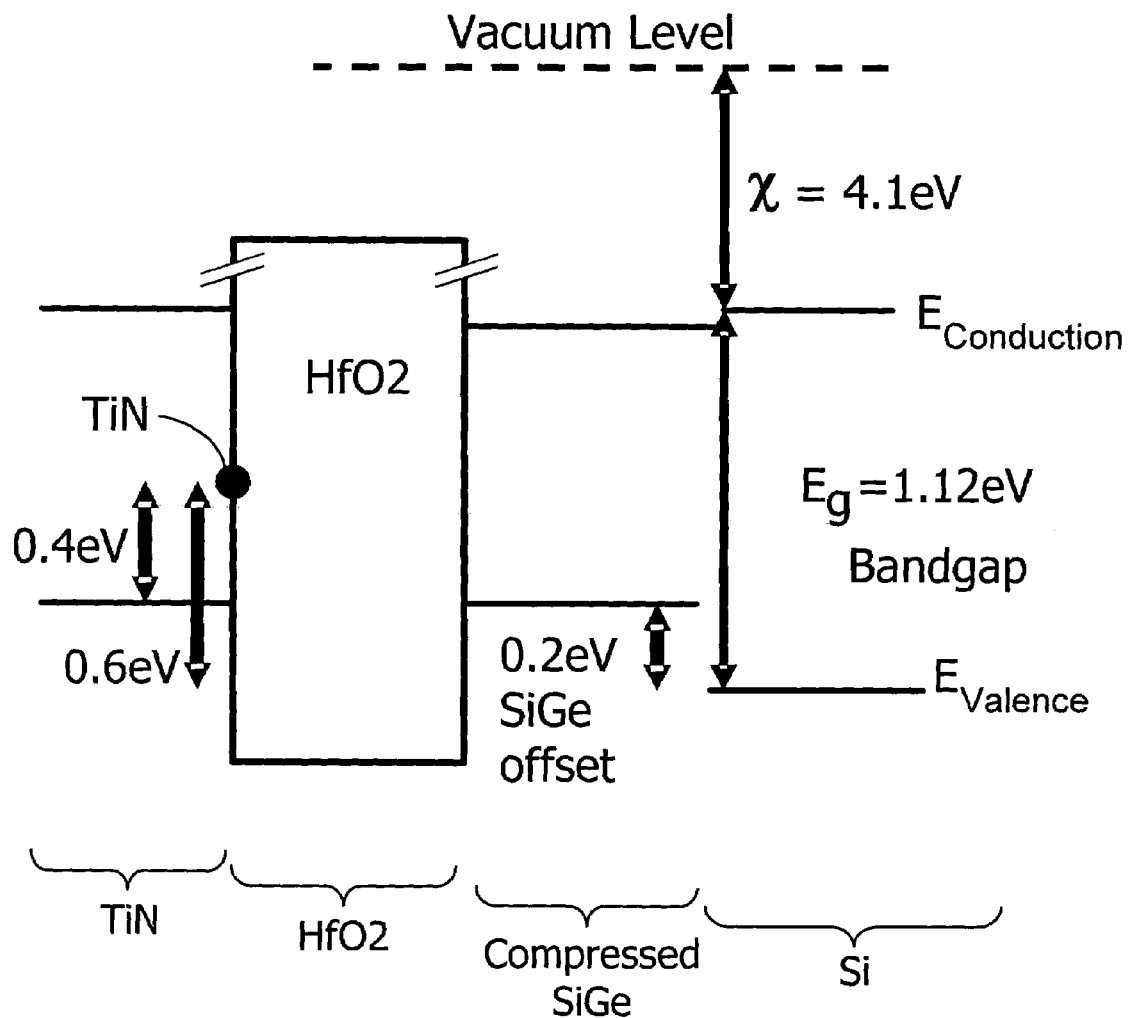
FIG. 9 depicts a comparison of the bandgap energies for Si, SiGe, $HfO_2$ and the Fermi level for TiN.

As explained herein, a selected embodiment of the invention may be used to form a hybrid substrate device with metal gate electrodes having one or more high-k gate dielectric layers. With appropriate selection of the hybrid substrate materials and orientations, PMOS metal gate devices formed on high-k gate dielectrics may be formed which have improved charge mobility as compared to silicon dioxide gate dielectric devices. In particular and as illustrated in FIG. 9, most of the thermally stable metals (i.e. TiN) have work functions that are mid-gap, and therefore can not be used for PMOS gate electrodes formed over silicon substrates. However, because SiGe has a valence band offset of about 0.2-0.25 eV from silicon, the work function for these metal gate electrodes formed over high-k dielectric gate layers (such as hafnium oxide) will be closer to the SiGe valence band edge.

Those skilled in semiconductor fabrication will appreciate that additional, conventional processing steps (not depicted) are performed to complete the fabrication of first and second gate electrodes into transistors. As examples, one or more extension implant, halo implant, spacer formation, and source/drain implant steps may be performed to complete the transistors. In addition, conventional backend processing (not depicted) typically including multiple levels of interconnect is then required to connect the transistors in a desired manner to achieve the desired functionality.

In one form there is provided herein a method for making a hybrid orientation semiconductor device by forming a first semiconductor layer having a first crystal orientation. Over the first semiconductor layer, a second semiconductor layer is formed having a second crystal orientation that is different from the first crystal orientation. In addition, a third semiconductor layer is formed over the first semiconductor layer. The third semiconductor layer is electrically isolated from the second semiconductor layer, and is formed by epitaxially growing SiGe having a third crystal orientation that is the same as the first crystal orientation. After etching or polishing the third semiconductor layer so that it is substantially coplanar with the second semiconductor layer, a first high-k gate dielectric layer and first metal gate electrode, polysilicon gate or SiGe electrode are formed over the third semiconductor layer, and a second high-k gate dielectric layer and second metal gate electrode are formed over the second semiconductor layer. While various materials may be used, the first semiconductor layer may be bulk (100) silicon, the second semiconductor layer may be (100) p-type silicon, the third semiconductor layer may be wholly or partly formed from epitaxially grown (110) n-type silicon germanium, and the high-k gate dielectric layer may be an oxide, silicate or aluminate of hafnium, zirconium, aluminum, lanthanum, strontium, titanium or any combination thereof. In a selected embodiment, the method may be used to fabricate a hybrid orientation CMOS semiconductor device which improves the PMOS mobility for a metal gate electrode formed with a high-k dielectric by epitaxially growing a SiGe substrate region for the PMOS devices. In a selected embodiment, NMOS devices are formed on a SOI substrate that has a (100)

surface while PMOS devices are formed on an epitaxially grown SiGe substrate having a (110) surface. Since the bandgap for SiGe is about 0.2 eV less than Si, the SiGe substrate relaxes the work function requirement for the PMOS metal gate electrode.

In another form, an integrated circuit structure and fabrication method is provided for forming a integrated semiconductor structure which includes a first semiconductor substrate region having a first crystallographic orientation and a second semiconductor substrate region having a second crystallographic orientation. As formed, the second semiconductor substrate region is formed at least in part from epitaxially grown silicon germanium and is electrically isolated from the first semiconductor substrate region. PMOS and NMOS transistors are formed over the first and second semiconductor substrate regions such that either or both of the NMOS and PMOS transistors include at least a first high-k dielectric gate layer or may optionally include two or more high-k dielectric gate layers.

In another form, a method of forming an integrated circuit structure is provided whereby a hybrid substrate is provided that includes a first silicon layer having a first crystallographic orientation (e.g., (110)). The first silicon layer is formed over and isolated from a second silicon layer (e.g., as part of an SOI device structure), and has a second crystallographic orientation (e.g., (100)) that is different from the first crystallographic orientation. By selectively etching a portion of the hybrid substrate, a portion of the second silicon layer is exposed and a layer of silicon germanium is epitaxially grown having a crystallographic orientation (e.g., (100)) that is the same as the second crystallographic orientation. The grown silicon germanium layer may optionally be etched back to be substantially coplanar with the first silicon layer before forming a first gate electrode structure over at the first silicon layer. As formed, the first gate electrode structure includes a relatively higher-k dielectric gate layer (such as hafnium oxide) and a first conductive layer (such as polysilicon or metal). In addition, a second gate electrode structure is formed over the grown silicon germanium layer. As formed, the second gate electrode structure may also include a relatively higher-k dielectric gate layer (such as hafnium oxide) and a second conductive layer (such as polysilicon or metal).

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 8 is for first well (not shown) in the layer 90 to be an n-doped well and the second well (not shown) in the layer 70 to be p-doped. Also the first and second gate electrode layers (112, 132) and the first and second conductive layers (114, 134) may be different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process, comprising:
   forming a first semiconductor layer having a first crystal orientation;
   forming a second semiconductor layer over the first semiconductor layer, wherein the second semiconductor layer has a second crystal orientation that is different from the first crystal orientation;
   forming a third semiconductor layer over the first semiconductor layer and within an opening in the second semiconductor layer, wherein the third semiconductor layer is electrically isolated from the second semiconductor layer and is formed by epitaxially growing SiGe from the first semiconductor layer having a third crystal orientation that is the same as the first crystal orientation; and
   forming a first high-k gate dielectric layer and first metal gate electrode over the second or third semiconductor layers.

2. The process of claim 1, further comprising forming a second high-k gate dielectric layer and second metal gate electrode over the second semiconductor layer.

3. The process of claim 1, wherein the high-k gate dielectric layer is formed from a material selected from the group consisting of oxides, silicates or aluminates of hafnium, zirconium, aluminum, lanthanum, strontium, titanium or any combination thereof.

4. The process of claim 1, wherein the second semiconductor layer comprises (100) p-type silicon and the third semiconductor layer comprises (110) n-type silicon germanium.

5. The process of claim 1, wherein the second semiconductor layer comprises (100) p-type silicon and the third semiconductor layer comprises (110) n-type silicon germanium that is epitaxially grown from an exposed surface of the first semiconductor layer.

6. The process of claim 1, wherein the second semiconductor layer comprises strained silicon.

7. The process of claim 1, further comprising forming the second semiconductor layer over a buried oxide layer to form a silicon-on-insulator substrate.

8. The process of claim 1, wherein the third semiconductor comprises a first part formed from epitaxially grown silicon and a second part formed from epitaxially grown silicon germanium.

9. The process of claim 1, wherein the third semiconductor layer comprises (111) n-type epitaxially grown silicon germanium.

10. The process of claim 1, wherein the second semiconductor layer comprises a silicon-on-insulator substrate.

11. A method of forming an integrated circuit structure, comprising:

providing a hybrid substrate comprising at least a first silicon layer having a first crystallographic orientation formed over and isolated from a second silicon layer having a second crystallographic orientation that is different from the first crystallographic orientation;

selectively etching a portion of the hybrid substrate to expose at least a portion of the second silicon layer;

epitaxially growing a silicon germanium layer on the exposed portion of the second silicon layer, said silicon germanium layer having a crystallographic orientation that is the same as the second crystallographic orientation;

etching the grown silicon germanium layer back to be substantially coplanar with the first silicon layer;

forming a first gate electrode structure over the first silicon layer, said first gate electrode structure comprising at least a first relatively high-k dielectric gate layer and a first conductive layer; and forming a second gate electrode structure over the grown silicon germanium layer, said second gate electrode structure comprising at least a second relatively high-k dielectric gate layer and a second conductive layer.

12. The method of claim 11, wherein the first and second conductive layers are formed from polysilicon or metal.

13. The method of claim 11, wherein the first and second relatively high-k dielectric gate layers are formed from hafnium dioxide.

14. The method of claim 11, wherein the first and second relatively high-k dielectric gate layers are formed from a material selected from the group consisting of oxides, silicates or aluminates of hafnium, zirconium, aluminum, lanthanum, strontium, titanium or any combination thereof.

15. The method of claim 11, wherein the first crystallographic orientation is (100) silicon and the second crystallographic orientation is (110) silicon.

* * * * *